(12) United States Patent
Couture et al.

(10) Patent No.: US 9,362,341 B2
(45) Date of Patent: Jun. 7, 2016

(54) X RAY DETECTION APPARATUS

(71) Applicant: GENERAL ELECTRIC COMPANY, Schenectady, NY (US)

(72) Inventors: Aaron Judy Couture, Schnectady, NY (US); Gautam Parthasarathy, Niskayuna, NY (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 36 days.

(21) Appl. No.: 14/100,419

(22) Filed: Dec. 9, 2013

(65) Prior Publication Data
US 2015/0162384 A1 Jun. 11, 2015

(51) Int. Cl.
*H01L 21/00* (2006.01)
*H01L 27/30* (2006.01)
*H01L 27/146* (2006.01)
*G01T 1/20* (2006.01)
*H01L 51/44* (2006.01)

(52) U.S. Cl.
CPC ............ *H01L 27/308* (2013.01); *G01T 1/2018* (2013.01); *H01L 27/14663* (2013.01); *H01L 51/441* (2013.01); *H01L 51/447* (2013.01)

(58) Field of Classification Search
CPC ..... H01L 27/307; H01L 27/308; H01L 51/44; H01L 51/0046; H01L 27/14663; H01L 51/447; H01L 51/441; H01L 51/0024
USPC .......................................................... 438/59
See application file for complete search history.

(56) References Cited

U.S. PATENT DOCUMENTS

| | | |
|---|---|---|
| 7,161,155 B1 | 1/2007 | Deych |
| 7,180,075 B2 | 2/2007 | Brabec et al. |
| 7,663,117 B2 | 2/2010 | Wittmann |
| 7,956,332 B2 | 6/2011 | Burr et al. |
| 8,513,612 B2 | 8/2013 | Levene et al. |
| 2007/0116179 A1 | 5/2007 | Spahn et al. |
| 2007/0272872 A1 | 11/2007 | Joshkin et al. |
| 2009/0026383 A1* | 1/2009 | Kim et al. ................ 250/370.11 |
| 2012/0121067 A1 | 5/2012 | Hayden et al. |
| 2013/0032723 A1* | 2/2013 | Lee et al. ...................... 250/369 |
| 2013/0082264 A1 | 4/2013 | Couture et al. |

(Continued)

FOREIGN PATENT DOCUMENTS

JP 2012181158 A * 9/2012

OTHER PUBLICATIONS

Iacchetti et al, Multi-Layer Organic Squaraine-Based Photodiode for Indirect X-Ray Detection, IEEE Transactions on Nuclear Science, vol. 59, No. 5, Oct. 2012, pp. 1862-1867.

(Continued)

*Primary Examiner* — Caridad Everhart
(74) *Attorney, Agent, or Firm* — Heslim Rothenberg Farley and Mesiti, PC; Brett Hutton

(57) ABSTRACT

There is set forth herein a method for making an apparatus for use in X ray detection comprising fabricating a first layered assembly 10 comprising a scintillator and first electrode layer, and laminating the first layered assembly 10 onto a second layered assembly 20 wherein the second layered assembly has a thin film transistor (TFT) array, wherein the TFT array includes a second electrode layer, wherein at least one of the first layered assembly and the second layered assembly includes an organic photodiode (OPD) absorber layer and wherein the laminating is absent use of an adhesive.

20 Claims, 14 Drawing Sheets

(56) References Cited

U.S. PATENT DOCUMENTS

2014/0191218 A1* 7/2014 Katz et al. .................. 257/40
2014/0361253 A1* 12/2014 Choi .................. H01L 27/32
257/40

OTHER PUBLICATIONS

Bernards et al., Organic Light-Emitting Devices with Laminated Top Contacts, Applied Physics Letters, vol. 84, No. 18, May 3, 2004, pp. 3675-3677.
Lee et al., Organic Light-Emitting Diodes Formed by Soft Contact Lamination, The National Academy of Sciences, vol. 101, No. 2, Jan. 13, 2004, pp. 429-433.
Bailey et al., Air-Processed Organic Photovoltaic Devices Fabricated with Hot Press Lamination, Organic Electronics, 2010, pp. 108-112.
Sharma et al., Role of Zinc Oxide Thickness on the Photovoltaic Performance of Laminated Organic Bulk-Heterojunction Solar Cells, Solar Energy Materials & Solar Cells, 2013, pp. 64-70.
Lee et al., Top Laminated Graphene Electrode in a Semitransparent Polymer Solar Cell by Simultaneous Thermal Annealing/Releasing Method, ACSNANO, vol. 5, No. 8, 2011, pp. 6564-6570.
Kaduwal et al., ITO-Free Laminated Concept for Flexible Organic Solar Cells, Solar Engergy Materials & Solar Cells, 2013, pp. 449-453.
Parthasarathy et al., U.S. Appl. No. 13/955,355, Organic X-Ray Detector, pending application filed Jul. 31, 2013.
Couture et al., U.S. Appl. No. 13/728,052, X-ray Detector Having Improved Noise Performance, pending application filed Dec. 27, 2012.

* cited by examiner

X RAY DETECTION APPARATUS

BACKGROUND

The invention relates generally to detectors and specifically to X ray detection apparatus.

Conventionally, scintillator-based X ray detection apparatus comprise components that are fabricated directly onto an array of pixel elements (e.g., TFT array). For example, layers of the detector can be deposited (e.g., spin coated, spray coated, etc.) on the TFT array, and a metal cathode can be used to electrically connect the detector to the scintillator. However, in the resulting configuration the photodetector can have a decreased quantum efficiency (e.g., by approximately 20%), due to photon absorption by the cathode. Such decreases in quantum efficiency of the detector can result in inefficiencies in the radiation detector system and/or inaccuracies in the reconstructed image.

BRIEF DESCRIPTION

There is set forth herein a method for making an apparatus for use in X ray detection comprising fabricating a first layered assembly comprising a scintillator and first electrode layer, and laminating the first layered assembly onto a second layered assembly wherein the second layered assembly has a thin film transistor (TFT) array, wherein the TFT array includes a second electrode layer, wherein at least one of the first layered assembly and the second layered assembly includes an organic photodiode (OPD) absorber layer and wherein the laminating is absent use of an adhesive.

DRAWINGS

DETAILED DESCRIPTION

Figure 1:
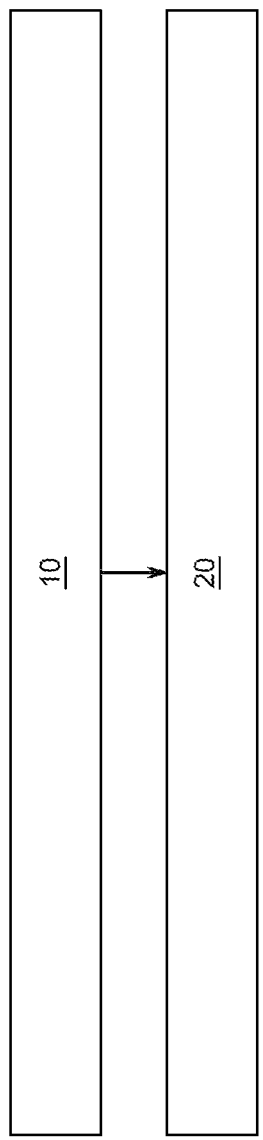
FIGS. 1 and 2 are schematic diagrams illustrating a method for fabricating an apparatus for use in X ray detection.
Figure 2:
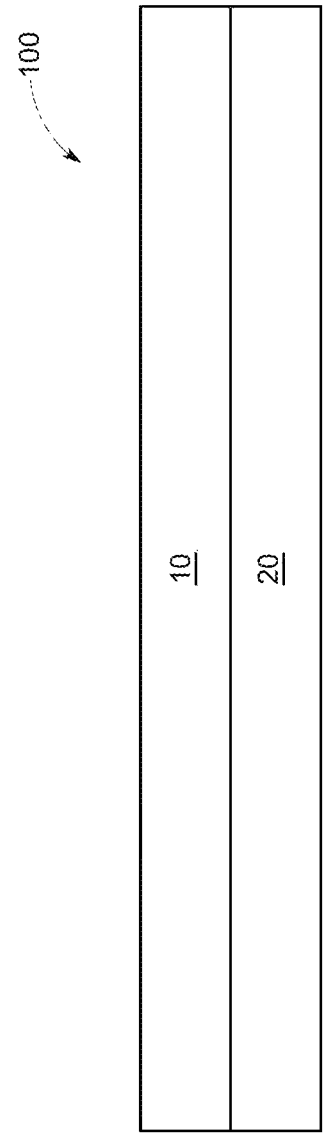

There is set forth herein a method for making an apparatus for use in X ray detection comprising fabricating a first layered assembly 10 comprising a scintillator and first electrode layer, and laminating the first layered assembly 10 onto a second layered assembly 20 wherein the second layered assembly has a thin film transistor (TFT) array, wherein the TFT array includes a second electrode layer, wherein at least one of the first layered assembly and the second layered assembly includes an organic photodiode (OPD) OPD absorber layer and wherein the laminating is absent use of an adhesive.

In one embodiment, a scintillator of a first layered assembly 10 and a TFT array of a second layered assembly 20 are each prefabricated structures. Each of the scintillator and the TFT array can be prefabricated planar structures.

According to method, a first layered assembly 10 comprising a scintillator can be laminated onto a second layered assembly 20 including a TFT array. The laminating of the first layered assembly 10 onto the second layered assembly 20 can be performed with use of one or more of heat and pressure. The laminating of the first layered assembly 10 onto the second layered assembly 20 can be performed absent use of an adhesive.

By the laminating of the first layered assembly 10 onto the second layered assembly 20 there can be provided an X ray detection apparatus 100. An interfacing layer of first layered assembly 10 herein refers to a layer most proximate second layered assembly 20. An interfacing layer of second layered assembly 20 herein refers to a layer most proximate first layered assembly 10.

In the development of methods and apparatus herein, it was observed that the common approach to fabrication of a X ray detection apparatus, wherein there is deposited one or more OPD layer to a prefabricated TFT array to fabricate a layered structure, depositing an electrode on the layered structure and then bonding a prefabricated scintillator onto the electrode deposited in the layered structure using an adhesive material layer exhibits various disadvantages. Included in the disadvantages is the disadvantage that a gap defined between the layered structure results in blurring of captured X ray images captured using the X ray detection apparatus. In addition an adhesive material layer can absorb light and limit optical transport.

In one aspect of a method herein, a first layered assembly 10 can comprise a scintillator layer and one or more additional layer deposited therein wherein a defined interfacing layer of the first layered assembly is polymer based. In a further aspect, a defined interfacing layer of the second layered assembly can be polymer based. The providing of interfacing layers of each of the first layered assembly and the second layered assembly to be polymer based facilitates a laminating of the first and second layered assemblies wherein bonding force bonding the layered assemblies together is provided by material of the interfacing layer, and accordingly use of adhesive materials can be avoided.

An advantage of laminating being performed absent use of adhesives is that a resulting apparatus for use in X ray detecting 100 can be absent a gap between the first layered assembly and the second layered assembly, and accordingly, blurring of an image captured with use of the apparatus 100 can be reduced and image quality can be improved. In the development of apparatus and methods herein it was determined that a presence of an adhesive material layer can reduce optical transport. Methods and apparatus herein which are absent use of an adhesive material layer can increase optical transport and light coupling efficiency.

Embodiments of a method set forth herein are described with respect to illustrative (prophetic and comparative) examples in reference to FIGS. 3-14.

EXAMPLE 1

Figure 3:
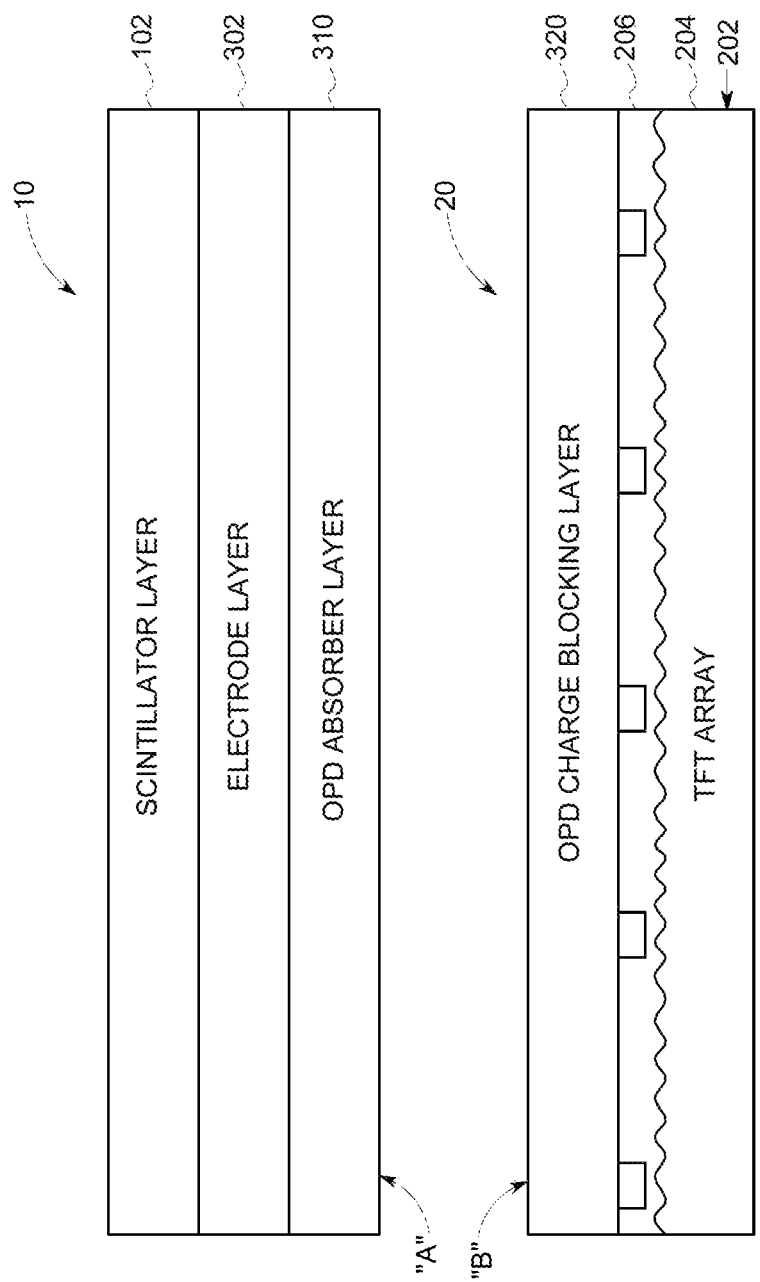
FIGS. 3 and 4 are schematic diagrams illustrating an example of a method as set forth herein.

A first layered assembly 10 as shown in FIG. 3 can be fabricated by depositing an electrode layer 302 onto a scintillator layer 102. The scintillator layer 102 can include a prefabricated planar scintillator. After depositing the electrode layer 302 onto the scintillator layer 102 an OPD absorber layer 310 can be deposited onto the electrode layer 302 to provide a first layered assembly 10 comprising a scintillator layer 102 an electrode layer 302 and an OPD absorber layer 310.

First layered assembly 10 can be laminated onto second layered assembly 20 as illustrated in FIG. 3.

The laminating of the first layered assembly and the second layered assembly can be performed with use of one or more of heat and pressure. The laminating of the first layered assembly and the second layered assembly can be performed absent use of an adhesive.

TFT array 202 can be a prefabricated TFT array and can include electrode layer 206. Second layered assembly 20 can be fabricated by depositing electron blocking layer 320 onto a TFT array 202. Electrode layer 206 can be a patterned electrode layer.

By depositing electron blocking layer 320 on TFT array 202 an interfacing layer of the second layered assembly 20 is formed that can be polymer based. In Example 1, interfacing layer at location "A" of first layered assembly and interfacing layer at location "B" can be both polymer based. Providing interfacing layers of the first layered assembly 10 and the second layered assembly 20 to be polymer based increases van der waal forces between laminated assemblies when lamination is complete.

Figure 4:
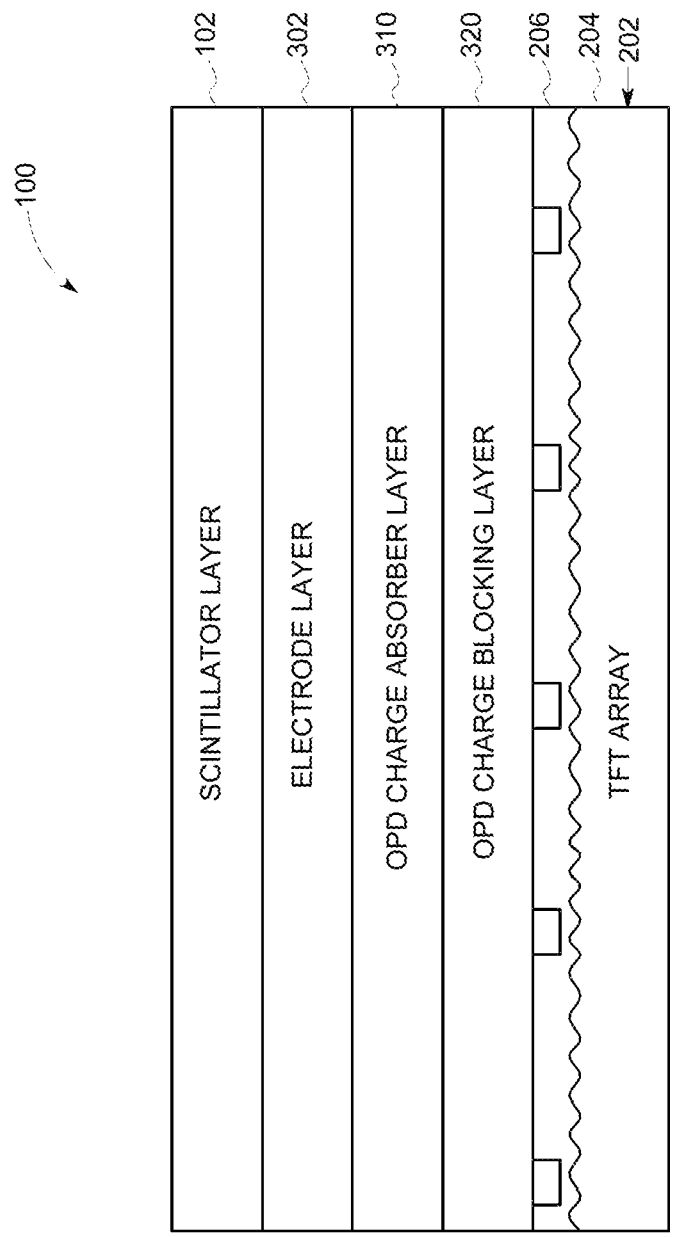

An apparatus 100 for use in X ray detection fabricated using a method described with reference to FIG. 3 is illustrated in FIG. 4. In the embodiment of FIG. 4, layer 102 is adjacent layer 302, layer 302 is adjacent layer 102 and layer 310, layer 310 is adjacent layer 302 and layer 320, layer 320 is adjacent layer 310 and layer 206 and layer 206 is adjacent layer 320 and layer 204.

END OF EXAMPLE 1

Exemplary construction detail of various components referenced in Example 1 are now set forth in further detail. Any described layer of apparatus 100 can include one or more sublayers.

Regarding scintillator layer 102, scintillator layer 102 in one embodiment can comprise a phosphor material that is capable of converting X rays to visible light. The wavelength region of light emitted by scintillator layer in one embodiment ranges from about 360 nm to about 830 nm. Suitable materials for scintillator layer 102 can include, but are not limited to, cesium iodide (CsI), CsI (Tl) (cesium iodide to which thallium has been added) and terbium-activated gadolinium oxysulfide (GOS). Such materials are commercially available in the form of a sheet or screen. Scintillator layer 102 can include in one embodiment a planarizing sublayer (not shown). Such planarizing sublayer of scintillator layer 102 can provide a planar surface for receipt of an adjacent layer of apparatus 100.

In one embodiment, scintillator layer 102 can include a prefabricated scintillator having a planarizing sublayer deposited thereon. Using a prefabricated scintillator in a method set forth herein can reduce fabrication costs. In some embodiments, scintillator layer 102 consists of unprefabricated material that is deposited in performance of a method set forth herein. In one embodiment scintillator layer 102 can include a prefabricated scintillator which is provided for use in a method set forth herein in rigid or semirigid form. In one embodiment a scintilator of scintillator layer 102 can be a scintilator manufactured under the tradename LANEX. Examples of such scintillators include scintillators having products designations LANEX FINE, LANEX MIN-R and LANEX FAST.

Regarding electrode layer 302, electrode layer 302 in one embodiment can comprise semi-transparent conductive material with compatible energy levels to allow extraction of charges without a barrier to extraction. Electrode layer 302 can be transparent at the wavelength of emissions from scintillator layer 102, particularly high in the transmission to visible light and low in resistance value.

In one embodiment in accordance the example set forth as Example 1, the first electrode layer 302 functions as the cathode and the second electrode layer 206 as an anode. In another embodiment, the first electrode layer 302 functions as the anode and the second electrode layer 206 as the cathode. Suitable anode materials include, but are not limited to, metals such as Al, Ag, Au, and Pt, metal oxides such as ITO, IZO, and ZO, and organic polymer based conductors such as p-doped conjugated polymers like PEDOT, PDOT, PDOT plus metal grids, PDOT plus d-sorbital (conductive glue), ZnO, graphene, and graphene oxide. Suitable cathode materials include transparent conductive oxides (TCO), thin films of metals such as gold and silver, metals such as Al, Ag, Au, and Pt, metal oxides such as ITO, IZO, and ZO and polymer based conductors such as n-doped conjugated polymers, PDOT, PDOT plus metal grids, PDOT plus d-sorbital (conductive glue), ZnO, graphene, and graphene oxide. Electrode layer 302 and electrode layer 206 can comprise one or more sublayer. Examples of suitable TCO include ITO, IZO, AZO, FTO, $SnO_2$, $TiO_2$, ZnO, indium zinc oxides (In—Zn—O series), indium gallum oxides, gallium zinc oxides, indium silicon zinc oxides, and IGZO. In many embodiments, ITO is used because of its low resistance and transparency. First electrode layer 302 can be formed as one layer over an entire pixel portion or can be divided forming a lateral offset and/or vertical offset or otherwise be patterned to correspond to a patterning of electrode layer 206 of TFT array 202. Where an electrode layer is provided as an interfacing layer of a first layered assembly 10 or a second layered assembly 20 a providing of the electrode layer to be polymer based can increase a strength of a bond between a first layered assembly and a second layered assembly, where a first layered assembly 10 is laminated onto a second layered assembly 20 and wherein the laminating is absent use of adhesive. Referring to the method of Example 1, wherein electrode layer 302 is deposited on scintillator layer 102 but does not form an interfacing to second layered assembly 20, the method of Example 1 facilitates selection of electrode layer 302 as a non polymer based material while facilitating a polymer based material to polymer based material bond between first layered assembly 10 and second layered assembly 20. Each of OPD absorber layer 310 and OPD charge blocking layer 320 in Example 1 can be selected to be polymer based.

Regarding OPD absorber layer 310 OPD absorber layer 310 can comprise in one embodiment at least a donor material and an acceptor material; the donor material contains at least one low bandgap polymer. In one embodiment OPD absorber layer 310 can comprise a continuous, unpatterned bulk hetero junction organic photodiode layer that absorbs light, separates charge and transports holes and electrons to the contact layers. In some embodiments, the OPD absorber layer 310 can be patterned. HOMO/LUMO levels of the donor and acceptor materials can be compatible with that of one or more charge blocking layer of apparatus 100 when present and of the first and second electrode layers 302 and 206 in order to allow efficient charge extraction without creating an energetic barrier. OPD absorber layer 310 can comprise a blend of a donor material and an acceptor material; more than one donor or acceptor can be included in the blend. In some embodiments, the donor and acceptor can be incorporated in the same molecule.

Suitable donor materials of OPD absorber layer 310 can comprise low bandgap polymer having LUMO ranging from about 1.9 eV to about 4.9 eV, particularly from 2.5 eV to 4.5 eV, more particularly from 3.0 eV to 4.5 eV; and HOMO ranging from about 2.9 eV to about 7 eV, particularly from 4.0 eV to 6 eV, more particularly from 4.5 eV to 6 eV. The low band gap polymers are conjugated polymers and copolymers comprised of units derived from substituted or unsubstituted monoheterocyclic and polyheterocyclic monomers such as thiophene, fluorene, phenylenvinylene, carbazole, pyrrolopyrrole, and fused heteropolycyclic monomers containing the thiophene ring, including, but not limited to, thienothiophene, benzodithiophene, benzothiadiazole, pyrrolothiophene monomers, and substituted analogs thereof. In particular embodiments, the low band gap polymers comprise units derived from substituted or unsubstituted thienothiophene, benzodithiophene, benzothiadiazole, carbazole, isothianaphthene, pyrrole, benzo-bis(thiadiazole), thienopyrazine, fluorene, thiadiazolequinoxaline, or combinations thereof. In the context of the low band gap polymers described herein, the term "units derived from" means that the units are each a residue comprising the monoheterocyclic and polyheterocyclic group, without regard to the substituents present before or during the polymerization; for example, "the low band gap polymers comprise units derived from thienothiophene" means that the low band gap polymers comprise divalent thienothiophenyl groups. Examples of suitable materials for use as low bandgap polymers in the organic X ray detectors according to the present invention include copolymers derived from substituted or unsubstituted thienothiophene, benzodithiophene, benzothiadiazole or carbazole monomers, and combinations thereof, such as poly[[4,8-bis[(2-ethylhexyl)oxy]benzo[1,2-b:4,5-b']dithiophene-2,6-diyl][3-fluoro-2-[(2-ethylhexyl)carbonyl]thieno[3,4-b]thiophene-diyl (PTB7), 2,1,3-benzothiadiazole-4,7-diyl[4,4-bis(2-ethylhexyl)-4H-cyclopenta[2,1-b:3,4-b']dithiophene-2,6-diyl (PCPDTBT), poly[[9-(1-octylnonyl)-9H-carbazole-2,7-diyl]-2,5-thiophenediyl-2,1,3-benzothiadiazole-4,7-diyl-2,5-thiophenediyl] (PCDTBT), poly[(4,40-bis(2-ethylhexyl) dithieno[3,2-b:20,30-d]silole)-2,6-diyl-alt-(2,1,3-benzothiadiazole)-4,7-diyl] (PSBTBT), poly((4,8-bis(octyloxy)benzo(1,2-b:4,5-b')dithiophene-2,6-diyl)(2-((dodecyloxy)carbonyl) thieno(3,4-b)thiophenediyl)) (PTB1), poly((4,8-bis(octyloxy)benzo(1,2-b:4,5-b')dithiophene-2,6-diyl)(2-((ethylhexyloxy)carbonyl) thieno(3,4-b)thiophenediyl)) (PTB2), poly((4,8-bis(octyl)benzo(1,2-b:4,5-b')dithiophene-2,6-diyl) (2-((ethylhexyloxy)carbonyl) thieno(3,4-b)thiophenediyl)) (PTB3), poly((4,8-bis-(ethylhexyloxybenzo(1,2-b:4,5-b')dithiophene-2,6-diyl)(2-((octyloxy)carbonyl)-3-fluoro)thieno(3,4-b)thiophenediyl)) (PTB4), poly((4,8-bis(ethylhexyloxybenzo(1,2-b:4,5-b') dithiophene-2,6-diyl)(2-((octyloxy)carbonyl) thieno(3,4-b) thiophenediyl)) (PTB5), poly((4,8-bis(octyloxy)benzo(1,2-b:4,5-b')dithiophene-2,6-diyl)(2-((butyloctyloxy)carbonyl) thieno(3,4-b)thiophenediyl)) (PTB6), poly[[5-(2-ethylhexyl)-5,6-dihydro-4,6-dioxo-4H-thieno[3,4-c]pyrrole-1,3-diyl][4,8-bis[(2-ethylhexyl)oxy]benzo[1,2-b:4,5-b'] dithiophene-2,6-diyl]] (PBDTTPD), poly[1-(6-{4,8-bis[(2-ethylhexyl)oxy]-6-methylbenzo[1,2-b:4,5-b']dithiophen-2-yl}-3-fluoro-4-methylthieno[3,4-b]thiophen-2-yl)-1-octanone] (PBDTTT-CF), and poly[2,1,3-benzothiadiazole-4,7-diyl-2,5-thiophenediyl(9,9-dioctyl-9H-9-silafluorene-2,7-diyl)-2,5-thiophenediyl] (PSiF-DBT). Other suitable materials are poly[5,7-bis(4-decanyl-2-thienyl) thieno[3,4-b] diathiazole-thiophene-2,5] (PDDTT), poly[2,3-bis(4-(2-ethylhexyloxy)phenyl)-5,7-di(thiophen-2-yl)thieno[3,4-b] pyrazine] (PDTTP), and polythieno[3,4-b]thiophene (PTT). In particular embodiments, suitable materials are copolymers derived from substituted or unsubstituted benzodithiophene monomers, such as the PTB1-7 series and PCPDTBT; or benzothiadiazole monomers, such as PCDTBT and PCPDTBT. In particular embodiments, the donor material is a polymer with a low degree of crystallinity or is an amorphous polymer. Degree of crystallinity can be increased by substituting aromatic rings of the main polymer chain. Long chain alkyl groups containing six or more carbons or bulky polyhedral oligosilsesquioxane (POSS) can result in a polymer material with a lower degree of crystallinity than a polymer having no substituents on the aromatic ring, or having short chain substituents such as methyl groups. Degree of crystallinity can also be influenced by processing conditions and means, including, but not limited to, the solvents used to process the material and thermal annealing conditions. Degree of crystallinity is readily determined using analytical techniques such as calorimetry, differential scanning calorimetry, X ray diffraction, infrared spectroscopy and polarized light microscopy.

Suitable materials for an acceptor of OPD absorber layer 310 can include fullerene derivatives such as [6,6]-phenyl-$C_{61}$-butyric acid methyl ester (PCBM), PCBM analogs such as $PC_{70}BM$, $PC_{71}BM$, $PC_{80}BM$, bis-adducts thereof, such as bis-$PC_{71}BM$, indene mono-adducts thereof, such as indene-$C_{60}$ monoadduct (ICMA) and indene bis-adducts thereof, such as indene-$C_{60}$ bisadduct (ICBA). Fluorene copolymers such as poly[(9,9-dioctylfluorenyl-2,7-diyl)-alt-(4,7-bis(3-hexylthiophen-5-yl)-2,1,3-benzothiadiazole)-2',2"-diyl] (F8TBT) can also be used, alone or with a fullerene derivative.

Regarding OPD charge blocking layer 320 as set forth in Example 1 and FIGS. 3 and 4, OPD charge blocking layer 320 can form a barrier to dark leakage current when the diode is reverse biased. OPD charge blocking layer 320 can be a continuous patterned or unpatterned conductive layer; in some embodiments, completely covering second electrode layer 206. OPD charge blocking layer 320 as set forth in Example 1 is disposed intermediate OPD absorber layer 310 and TFT array 202. Where electrode layer 206 of TFT array 202 is configured as an anode, OPD charge blocking layer 320 can be provided by an electron blocking layer. Where electrode layer 206 of TFT array 202 is configured as a cathode, OPD charge blocking layer 320 can be provided by a hole blocking layer.

A range of materials satisfying the HOMO/LUMO/mobility requirements can be used for when OPD charge blocking layer 320 is an electron blocking layer, including, but not limited to, aromatic tertiary amines and polymeric aromatic tertiary amines. Examples of suitable materials include poly-TPD (poly(4-butylphenyl-diphenyl-amine), poly(N,N'-bis (4-butylphenyl)-N,N'-bis(phenyl)benzidine, 4,4',N,N'-diphenylcarbazole, 1,3,5-tris(3-methyldiphenyl-amino) benzene, N,N'-bis(1-naphtalenyl)-N—N'-bis (phenylbenzidine), N,N'-Bis-(3-methylphenyl)-N,N'-bis (phenyl)benzidine, N,N'-bis(2-naphtalenyl)-N—N'-bis-(phenylbenzidine), 4,4',4"-tris(N,N-phenyl-3-methylphenylamino)triphenylamine, poly[9,9-dioctylfluorenyl-2,7-dyil)-co-(N,N'bis-(4-butylphenyl-1,1'-biphenylene-4,4-diamine)], poly(N,N'-bis(4-butylphenyl)-N,N'-bis(phenyl)benzidine, poly[(9,9-dihexylfluorenyl-2,7-diyl)-co-(N,N'bis{p-butylphenyl}-1,4-diamino-phenylene)], NiO, MoO3, tri-p-tolylamine, 4,4',4"-tris[phenyl(m-tolyl) amino]triphenylamine, 4,4',4"-tris[2-naphthyl(phenyl)

amino]triphenylamine, 1,3,5-tris[(3-methylphenyl)phenylamino]benzene, 1,3,5-tris(2-(9-ethylcabazyl-3)ethylene)benzene, 1,3,5-tris(diphenylamino)benzene, tris[4-(diethylamino)phenyl]amine, tris(4-carbazoyl-9-ylphenyl)amine, titanyl phthalocyanine, tin(IV) 2,3-naphthalocyanine dichloride, N,N,N',N'-tetraphenyl-naphthalene-2,6-diamine, tetra-N-phenylbenzidine, N,N,N',N'-tetrakis(2-naphthyl)benzidine, N,N,N',N'-tetrakis(3-methylphenyl)-3,3'-dimethylbenzidine, N,N,N',N'-tetrakis(4-methoxyphenyl)benzidine, poly(2-vinylnaphthalene), poly(2-vinylcarbazole), poly(N-ethyl-2-vinylcarbazole), poly(copper phthalocyanine), poly[bis(4-phenyl)(2,4,6-trimethylphenyl)amine], dipyrazino[2,3-f:2',3'-h]quinoxaline-2,3,6,7,10,11-hexacarbonitrile 99%, N,N'-diphenyl-N,N'-di-p-tolylbenzene-1,4-diamine, 4-(diphenylamino)benzaldehyde diphenylhydrazone, N,N'-di(2-naphthyl-N,N'-diphenyl)-1,1'-biphenyl-4,4'-diamine, 9,9-dimethyl-N,N'-di(1-naphthyl)-N,N'-diphenyl-9H-fluorene-2,7-diamine, 2,2'-dimethyl-N,N'-di-[(1-naphthyl)-N,N'-diphenyl]-1,1'-biphenyl-4,4'-diamine, 4-(dibenzylamino)benzaldehyde-N,N-diphenyl-hydrazone, 4,4'-Cyclohexylidenebis[N,N-bis(4-methylphenyl)benzenamine], N,N'-Bis(phenanthren-9-yl)-N,N'-bis(phenyl)-benzidine, N,N'-Bis(3-methylphenyl)-N,N'-diphenylbenzidine, 4,4'-Bis(3-ethyl-N-carbazolyl)-1,1'-biphenyl, 1,4-Bis(diphenylamino)benzene, 4,4'-Bis(N-carbazolyl)-1,1'-biphenyl, 4,4'-Bis(N-carbazolyl)-1,1'-biphenyl, and 1,3-Bis(N-carbazolyl)benzene. In some embodiments, a donor material can function as the EBL material, and a charge blocking layer can be absent.

Suitable materials for OPD charge blocking layer 320 when functioning as a hole blocking layer include phenanthroline compounds, for example, 2,9-dimethyl-4,7-diphenyl-1,10-phenanthroline (BCP), 4-biphenyloxolate aluminum(III) bis(2-methyl-8-quinolinato)-4-phenylphenolate (BAlq), 2,4-diphenyl-6-(49-triphenylsilanyl-biphenyl-4-yl)-1,3,5-triazine (DTBT), C60, (4,4'-N,N'-dicarbazole)biphenyl (CBP), as well as a range of metal oxides, such as $TiO_2$, ZnO, $Ta_2O_5$, and $ZrO_2$.

An optional charge blocking layer, as described in alternative embodiments set forth herein, can be disposed between the OPD absorber layer 310 and the first electrode layer 302. Where the first electrode layer 302 is a cathode, the charge blocking layer can be a hole blocking layer. Where the first electrode layer 302 is an anode, the charge blocking layer can be an electron blocking layer.

Regarding TFT array 202 TFT array, 202 can comprise a thin film transistor (TFT) layer 204 and an electrode layer 206. TFT layer 204 can comprise a two dimensional array of passive or active pixels which store charge for read out by electronics, disposed on an active layer formed of amorphous silicon or an amorphous metal oxide, or organic semiconductors. Suitable amorphous metal oxides include zinc oxide, zinc tin oxide, indium oxides, indium zinc oxides (In—Zn—O series), indium gallium oxides, gallium zinc oxides, indium silicon zinc oxides, and indium gallium zinc oxides (IGZO). IGZO materials include $InGaO_3(ZnO)_m$ where m is <6) and $InGaZnO_4$. Suitable organic semiconductors include, but are not limited to, conjugated aromatic materials, such as rubrene, tetracene, pentacene, perylenediimides, tetracyanoquinodimethane and polymeric materials such as polythiophenes, polybenzodithiophenes, polyfluorene, polydiacetylene, poly(2,5-thiophenylene vinylene) and poly(p-phenylene vinylene) and derivatives thereof. Regarding electrode layer 206, electrode layer 206 can be patterned so that each pixel of TFT layer 204 comprises a patterned electrode of electrode layer 206. In one embodiment, TFT array 202 is a prefabricated TFT array.

Additional examples of methods for fabrication of X ray detection apparatus which include component layers as set forth herein in Example 1 are described in Example 2-5.

EXAMPLE 2

Figure 5:
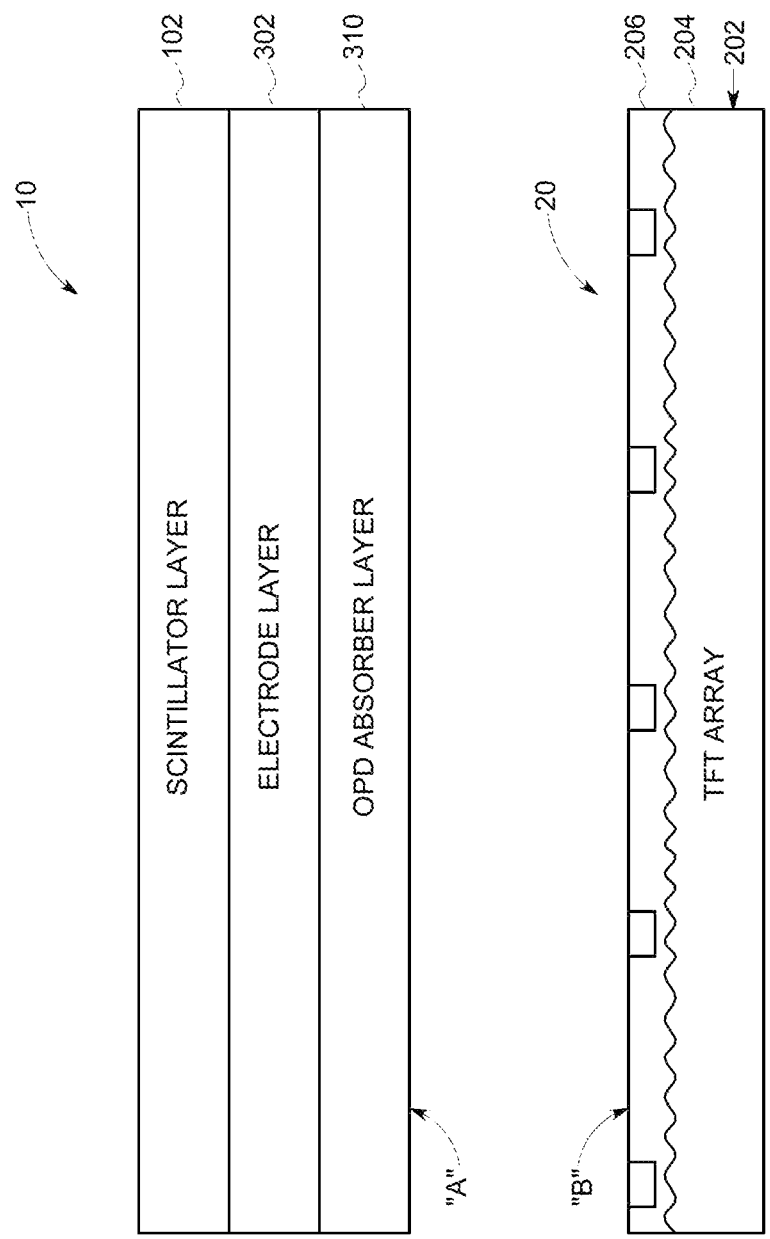
FIGS. 5 and 6 are schematic diagrams illustrating an example of a method as set forth herein.

A first layered assembly 10 as shown in FIG. 5 can be fabricated by depositing an electrode layer 302 onto a scintillator layer 102. The scintillator layer 102 can include a prefabricated planar scintillator. After depositing the electrode layer 302 onto the scintillator layer 102 an OPD absorber layer 310 can be deposited onto the electrode layer 302 to provide a first layered assembly 10 comprising a scintillator layer 102 an electrode layer 302 and an OPD absorber layer 310.

First layered assembly 10 can be laminated onto second layered assembly 20.

The laminating of the first layered assembly and the second layered assembly can be performed with use of one or more of heat and pressure. The laminating of the first layered assembly and the second layered assembly can be performed absent use of an adhesive.

Second layered assembly 20 can be provided by a TFT array 202. TFT array 202 can be a prefabricated TFT array and can include electrode layer 206. Electrode layer 206 can be a patterned electrode layer.

Figure 6:
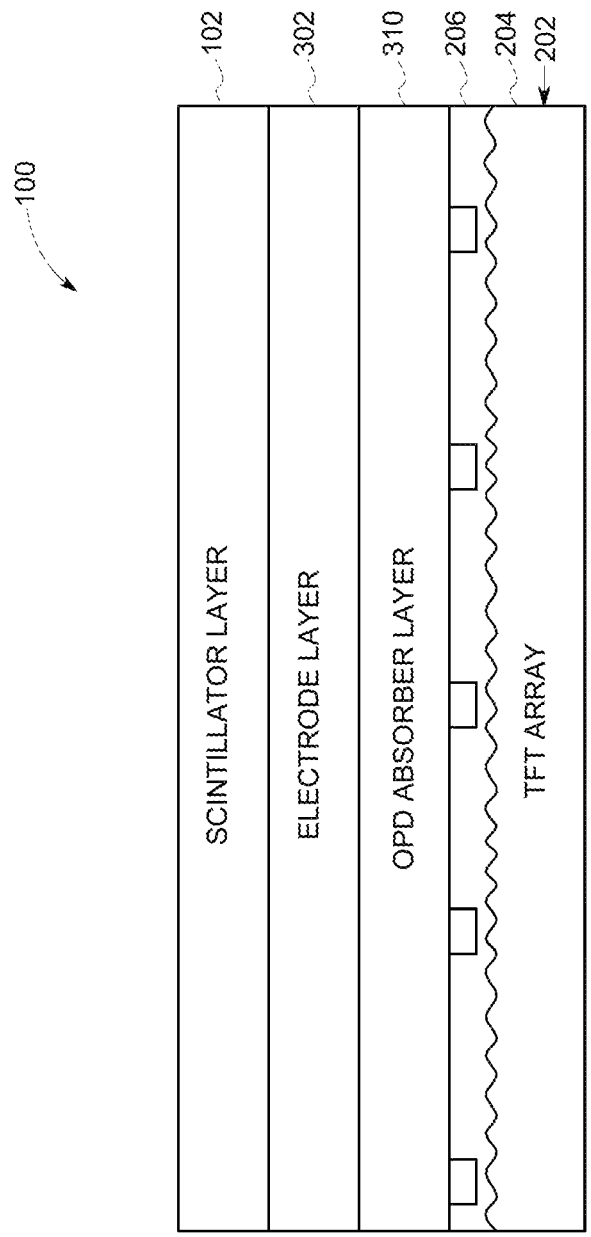

An apparatus 100 for use in X ray detection fabricated using the method as depicted in FIG. 5 is illustrated in FIG. 6. In the embodiment of FIG. 6, layer 102 is adjacent layer 302, layer 302 is adjacent layer 102 and layer 310, layer 310 is adjacent layer 302 and layer 206, and layer 206 is adjacent layer 310 and layer 204.

END OF EXAMPLE 2

EXAMPLE 3

Figure 7:
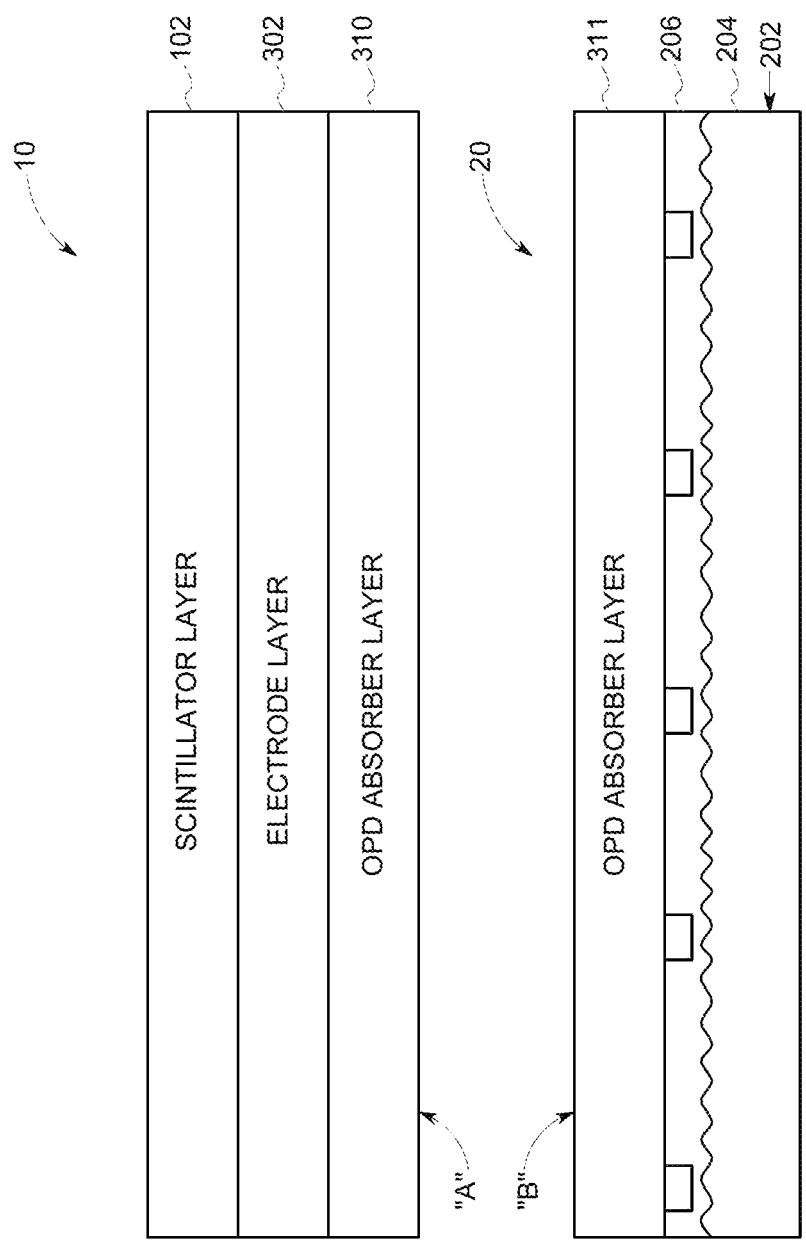
FIGS. 7 and 8 are schematic diagrams illustrating an example of a method as set forth herein.

A first layered assembly 10 as shown in FIG. 7 can be fabricated by depositing an electrode layer 302 onto a scintillator layer 102. The scintillator layer 102 can include a prefabricated planar scintillator. After depositing the electrode layer 302 onto the scintillator layer 102 an OPD absorber layer 310 can be deposited onto the electrode layer 302 to provide a first layered assembly 10 comprising a scintillator layer 102 an electrode layer 302 and a first OPD absorber layer 310.

First layered assembly 10 can be laminated onto second layered assembly 20 as illustrated in FIG. 7.

The laminating of the first layered assembly and the second layered assembly can be performed with use of one or more of heat and pressure. The laminating of the first layered assembly and the second layered assembly can be performed absent use of an adhesive.

TFT array 202 can be a prefabricated TFT array and can include electrode layer 206. Second layered assembly 20 can be fabricated by depositing a second OPD absorber layer 311 onto a TFT array 202. Second OPD absorber layer 311 can have the material composition of OPD absorber layer 310. Electrode layer 206 can be a patterned electrode layer.

By depositing second OPD absorber 311 on TFT array 202 an interfacing layer of the second layered assembly 20 is formed that can be polymer based. In Example 3, interfacing layer at location "A" of first layered assembly and interfacing layer at location "B" can be both polymer based. Providing interfacing layers of each of first layered assembly 10 and second layered assembly 20 to be polymer based increases van der waal forces between laminated assemblies when lamination is complete.

Figure 8:
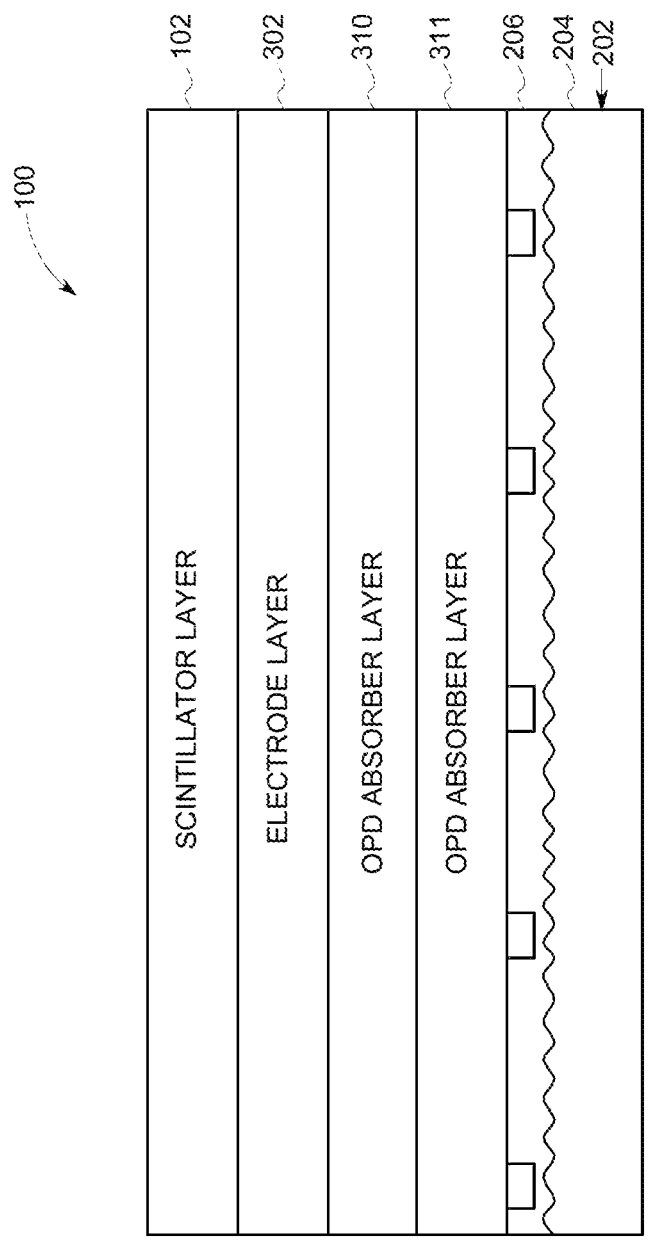

An apparatus 100 for use in X ray detection fabricated using a method described with reference to FIG. 7 is illustrated in FIG. 8. In the embodiment of FIG. 8, layer 102 is adjacent layer 302, layer 302 is adjacent layer 102 and layer 310, layer 310 is adjacent layer 302 and layer 311, layer 311 is adjacent layer 310 and layer 206 and layer 206 is adjacent layer 311 and layer 204.

END OF EXAMPLE 3

EXAMPLE 4

Figure 9:
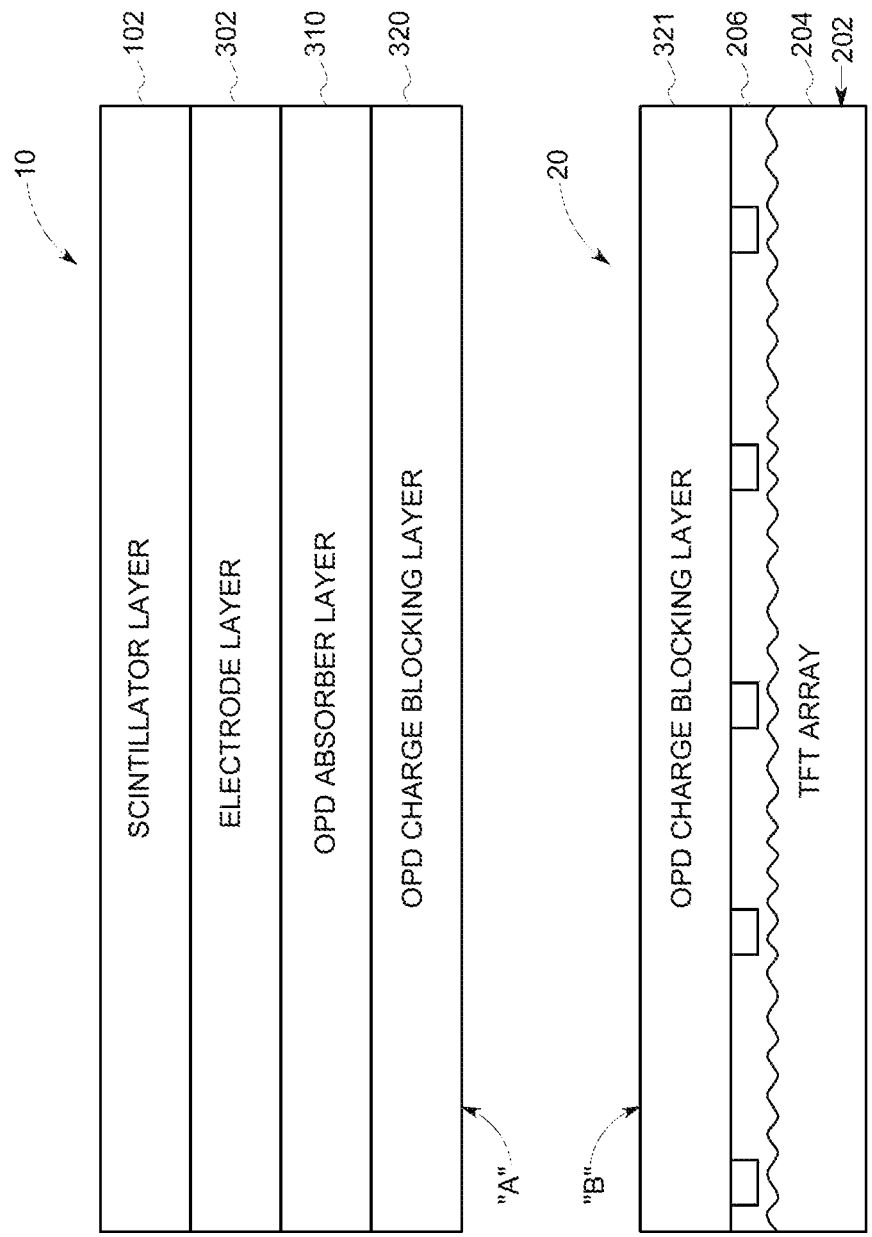
FIGS. 9 and 10 are schematic diagrams illustrating an example of a method as set forth herein.

A first layered assembly 10 as shown in FIG. 9 can be fabricated by depositing an electrode layer 302 onto a scintillator layer 102. The scintillator layer 102 can include a prefabricated planar scintillator. After depositing the electrode layer 302 onto the scintillator layer 102 an OPD absorber layer 310 can be deposited onto the electrode layer 302. After depositing of OPD absorber layer 310 an OPD charge blocking layer 320 can be deposited into OPD absorber layer 310.

First layered assembly 10 can be laminated onto second layered assembly 20 as illustrated in FIG. 9.

The laminating of the first layered assembly and the second layered assembly can be performed with use of one or more of heat and pressure. The laminating of the first layered assembly and the second layered assembly can be performed absent use of an adhesive.

TFT array 202 can be a prefabricated TFT array and can include electrode layer 206. Second layered assembly 20 as shown in FIG. 7 can be fabricated by depositing a second OPD charge blocking layer 321 onto a TFT array 202. Second OPD charge blocking layer 321 can have the material composition of OPD charge blocking layer 320. Electrode layer 206 can be a patterned electrode layer.

By depositing electrode layer 308 on TFT array 202 an interfacing layer of the second layered assembly 20 is formed that can be polymer based. In Example 3, interfacing layer at location "A" of first layered assembly and interfacing layer at location "B" can be both polymer based. Providing interfacing layers of each of first layered assembly 10 and second layered assembly 20 to be polymer based increases van der waal forces between laminated assemblies when lamination is complete.

Figure 10:
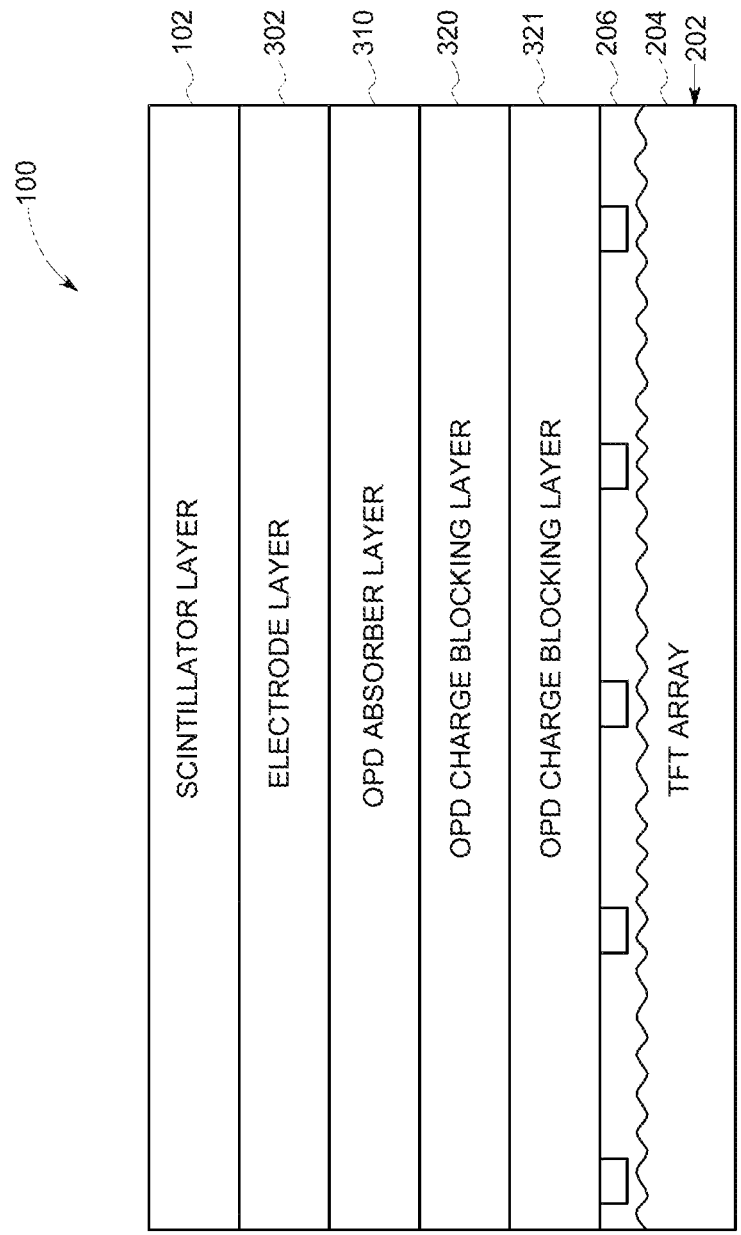

An apparatus 100 for use in X ray detection fabricated using the method described with reference to FIG. 9 is illustrated in FIG. 10. In the embodiment of FIG. 10, layer 102 is adjacent layer 302, layer 302 is adjacent layer 102 and layer 310, layer 310 is adjacent layer 302 and layer 320, layer 320 is adjacent layer 310 and layer 321, layer 321 is adjacent layer 320 and layer 206, and layer 206 is adjacent layer 321 and layer 204.

END OF EXAMPLE 4

EXAMPLE 5

Figure 11:
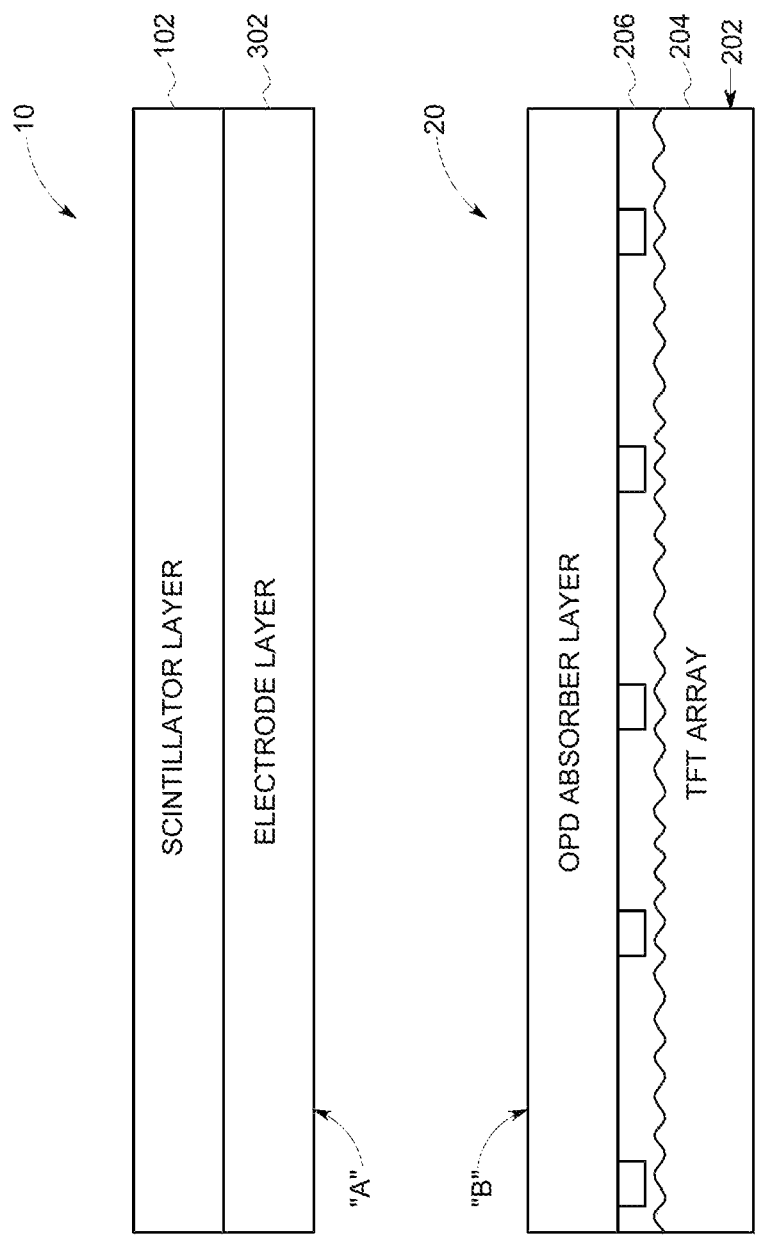
FIGS. 11 and 12 are schematic diagrams illustrating an example of a method as set forth herein.

A first layered assembly 10 as shown in FIG. 11 can be fabricated by depositing an electrode layer 302 onto a scintillator layer 102. The scintillator layer 102 can include a prefabricated planar scintillator.

First layered assembly 10 can be laminated onto second layered assembly 20 as illustrated in FIG. 11.

The laminating of the first layered assembly and the second layered assembly can be performed with use of one or more of heat and pressure. The laminating of the first layered assembly and the second layered assembly can be performed absent use of an adhesive.

TFT array 202 can be a prefabricated TFT array and can include electrode layer 206. Second layered assembly 20 as shown in FIG. 7 can be fabricated by depositing an OPD absorber layer 310 onto a TFT array 202. Electrode layer 206 can be a patterned electrode layer.

By depositing OPD absorber layer 310 on TFT array 202 an interfacing layer of the second layered assembly 20 is formed that can be polymer based. In Example 5, interfacing layer at location "A" of first layered assembly and interfacing layer at location "B" can be both polymer based. Providing interfacing layers of each of first layered assembly 10 and second layered assembly 20 to be polymer based increases van der waal forces between laminated assemblies when lamination is complete.

As is the case with Examples 1-4, a deposition of an electrode layer 302 on a scintillator layer 102 can avoid a deposition of an electrode layer 302 on one or more OPD layer. A deposition of electrode layer 302 onto one or more OPD absorber layer can potentially reduce light coupling efficiency due to ion bombardment of the one or more OPD absorber layer. Accordingly, depositing an electrode layer 302 on a scintillator layer 102 can further improve light coupling efficiency from a scintillator to an OPD absorber layer.

Where an electrode layer 302 is provided as an interfacing layer of a first layered assembly 10 or a second layered assembly 20 a providing of the electrode layer 302 to be polymer based can increase a strength of a bond between a first layered assembly 10 and a second layered assembly 20, where a first layered assembly is laminated onto a second layered assembly and wherein the laminating is absent use of adhesive.

Figure 12:
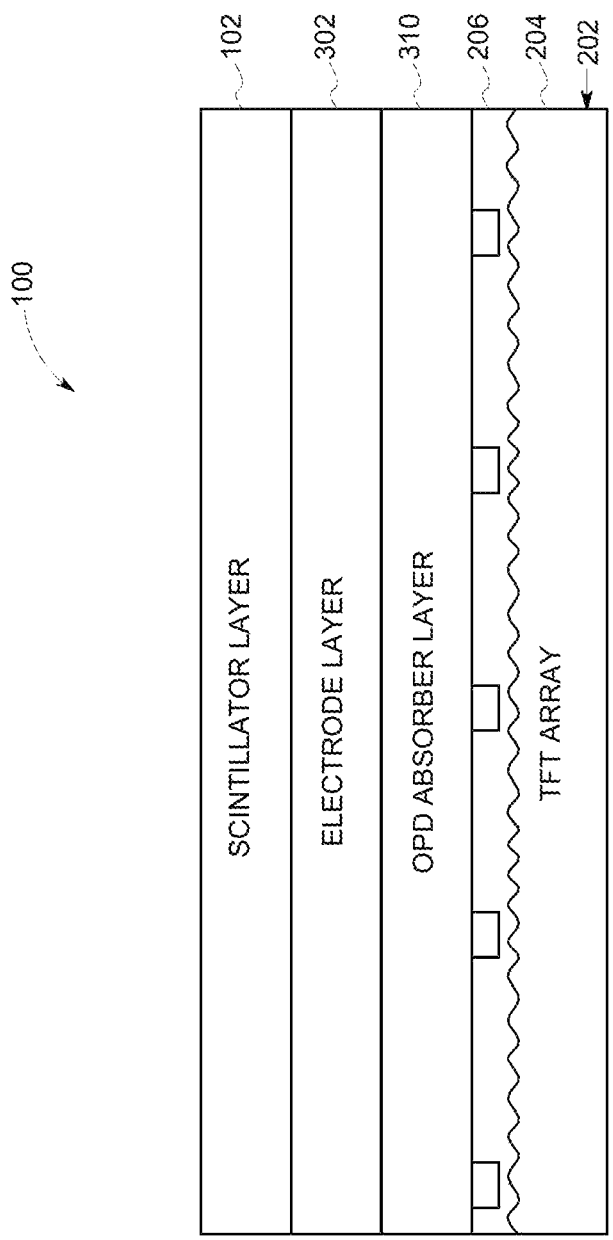

An apparatus 100 for use in X ray detection fabricated using the method described with reference to FIG. 11 is illustrated in FIG. 12. In the embodiment of FIG. 12, layer 102 is adjacent layer 302, layer 302 is adjacent layer 102 and layer 310, layer 310 is adjacent layer 302 and layer 206, and layer 206 is adjacent layer 310 and layer 204.

END OF EXAMPLE 5

In Examples 1-5 methods are set forth wherein a laminating is performed absent use of an adhesive material. In one embodiment, first layered assembly 10 and second layered assembly 20 can be laminated in a manner so that an adhesive material is disposed between an interfacing layer of the first layered assembly and the second layered assembly. The adhesive materials can comprise, e.g., an epoxy adhesive material, an acrylic adhesive material and a polyiminide adhesive material. Where a laminating herein includes use of an adhesive material, the resulting apparatus for use in X ray detection can include an adhesive material layer. Where a laminating herein is performed absent use of an adhesive material a resulting detection apparatus for use in X ray imaging can be absent of an adhesive material layer. Where a laminating is performed with use of an adhesive material layer, one or more of a first layered assembly 10 and a second layered assembly 20 can be regarded as including an adhesive material layer. For example, if the method of Example 5 (FIGS. 11 and 12) is modified to include use of an adhesive material layer, first layered assembly 10 can be regarded to include an interfacing layer provided by an adhesive material if an adhesive material layer (not shown) is applied to electrode layer 302 prior to laminating. Second layered assembly 20 (FIG. 11) can be regarded to include an interfacing layer provided by an adhesive material layer if an adhesive material layer (not shown) is applied to OPD absorber layer 310 prior to laminating.

A laminating of first layered assembly 10 to second layered assembly 20 herein can comprise application of one or more of heat and pressure. In one embodiment the laminating can comprise application of pressure in the presence of heat. A laminating can include use of a laminator apparatus such a roll laminator apparatus. A roll laminator apparatus can comprise a plurality of rubberized rollers applying layered assemblies herein together. In one embodiment, an adhesive can be disposed between first and second layered assemblies being subject to lamination.

By performing laminating without use of adhesive a space (gap) between a first layered assembly and a second layered assembly can be eliminated. In the development of methods and apparatus set forth herein it was determined that a gap between a first layered assembly 10 and a second layered assembly 20 can encourage a blur in a resulting image captured using apparatus 100. Accordingly, by fabricating apparatus 100 without use of an adhesive material layer image blur can be reduced and image quality can be improved. In the development of apparatus and methods herein it was determined that a presence of an adhesive material layer can reduce optical transport. Accordingly, by fabricating apparatus 100 without use of an adhesive material layer optical transport and light coupling efficiency can be improved. In various embodiment, interfacing layers of a first layered assembly 10 and second layered assembly 20 can be polymer based. Factors that determine whether two polymer based material layers can bond when subjected to one or more of heat and pressure during a laminating can include glass transition temperature ($T_g$) of the polymer based material layers, the temperature during the laminating and the pressure applied to the polymer based material members during the laminating. If one or more of the temperature and pressure are high enough polymer chains of polymer based material layers can move an intertwine tending to hold the material layers together. In some embodiments as are set forth by material lists herein, an interfacing layer of one of first layered assembly 10 or second layer assembly 20 is polymer based and an interfacing layer of a remaining of the first layered assembly 10 or second layered assembly 20 is not polymer based. In the development of apparatus 100 it was determined that providing at least one interfacing layer of first layered assembly 10 and second layered assembly 20 to be polymer based can facilitate lamination of the assemblies wherein the lamination is performed without use of an adhesive, and can improve defect and defect and topography tolerance of apparatus 100 (relative to that which would be seen with lamination being performed with use of an adhesive).

Regarding depositing processes set forth herein a depositing processes can comprise, e.g., a wet deposition process or dry deposition processes. A wet deposition process can comprise, e.g., one or more of spin coating, sputter deposition, spray coating, slit coating, application of a particle in a plastic binder and slot die coating. A dry deposition processes can comprise, e.g., one or more physical vapor deposition (PVD) and thermal evaporation. Where a first layer as set forth herein is deposited onto a second adjacent layer, apparatus 100 can be regarded as having a deposition bond that bonds the first layer and the adjacent layer. Where a first layer as set forth herein is bonded to a second layer by laminating absent use of an adhesive, apparatus 100 can be regarded as having a laminate bond absent an adhesive that bonds the first layer and the adjacent layer.

As explained with reference to Examples 1-5, a deposition of an electrode layer 302 on a scintillator layer 102 can avoid a deposition of an electrode layer 302 on one or more OPD layer, which can further (by avoiding ion bombardment of an OPD absorber layer) improve light coupling efficiency from a scintillator layer 102 to an OPD absorber layer. A deposition of electrode layer 302 on scintillator layer 102 can facilitate electrode deposition using a high quality deposition process that improves quantum efficiency of apparatus 100. In one embodiment electrode layer 302 can be deposited by sputter deposition of indium tin oxide (ITO). By comparison sputter deposition of ITO onto an OPD layer can degrade performance of OPD absorber layer 310 due to ion bombardment.

Figure 13:
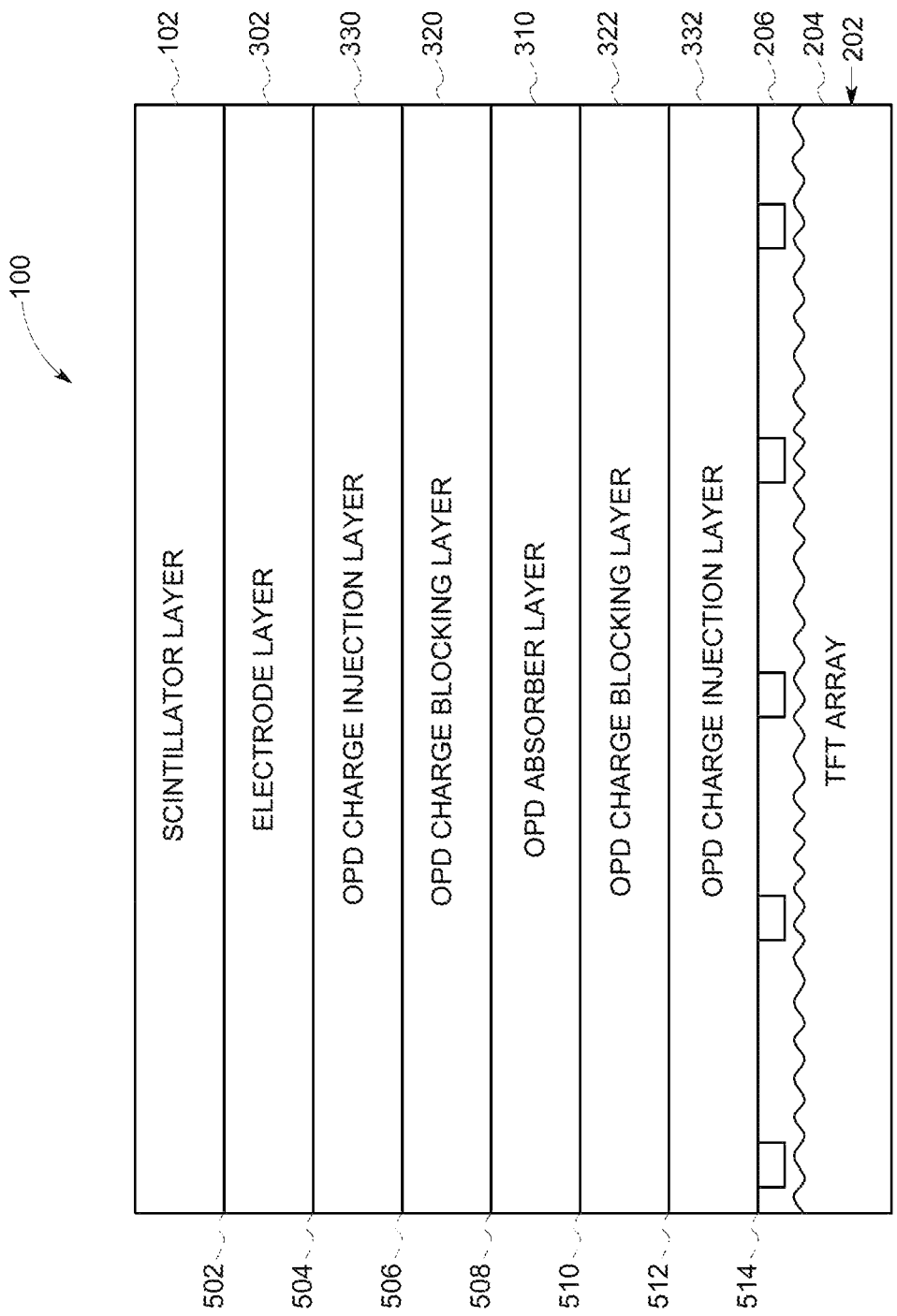
FIG. 13 is a schematic diagram illustrating additional methods as set forth herein.

In the foregoing Examples 1-5 various embodiments wherein a first layered assembly is laminated onto a second layered assembly are described. Additional embodiments wherein an X ray detection apparatus 100 can be formed by laminating a first layered assembly 10 onto a second layered assembly 20 are set forth with reference to FIG. 13. Each electrode layer depicted in FIG. 13 can have a material composition described with reference to any electrode layer set forth herein. Each OPD charge injection layer depicted in FIG. 13 can have a material composition described with reference to any OPD injection layer set forth herein. Each OPD charge blocking layer depicted in FIG. 13 can have a material composition described with reference to any OPD charge blocking layer set forth herein. Each OPD absorber layer depicted in FIG. 13 can have a material composition described with reference to any OPD absorber layer set forth herein. FIG. 13 depicts an arrangement of adjacent layers.

FIG. 13 illustrates an exemplary X ray detection apparatus 100. X ray detection apparatus 100 includes scintillator layer 102, electrode layer 302, OPD charge injection layer 330, OPD charge blocking layer 320, OPD absorber layer 310, OPD charge blocking layer 322, OPD charge injection layer 332, electrode layer 206 and TFT layer 204. In one embodiment, electrode layer 302 is provided by a cathode layer, OPD charge injection layer 330 is provided by an electron injection layer, OPD charge blocking layer 320 is provided by a hole blocking layer, OPD charge blocking layer 322 is provided by an electron blocking layer, OPD charge injection layer 332 is provide by a hole injection layer, and electrode layer 206 is provided by an anode. In one embodiment, electrode layer 302 is provided by an anode, OPD charge injection layer 330 is provided by a hole injection layer, OPD charge blocking layer 320 is provided by an electron blocking layer, OPD charge blocking layer 322 is provided by a hole blocking layer, OPD charge injection layer 332 is provide by an electron injection layer, and electrode layer 206 is provided by a cathode.

A fabrication of X ray detection apparatus 100 can include laminating a first layered assembly 10 onto a second layered assembly 20 as shown generically in FIG. 1.

In one embodiment, the first layered assembly 10 includes the layer above dashed line 502 and the second layered assembly 20 includes the layers below dashed line 502 so that an interfacing layer of the first layered assembly 10 to the second layered assembly 20 is provided by scintillator layer 102 and further so that an interfacing layer of the second layered assembly 20 to the first layered assembly 10 is provided by electrode layer 302.

In one embodiment, the first layered assembly 10 includes the layers above dashed line 504 and the second layered assembly 20 includes the layers below dashed line 504 so that an interfacing layer of the first layered assembly 10 to the second layered assembly 20 is provided by electrode layer 330 and further so that an interfacing layer of the second layered assembly 20 to the first layered assembly 10 is provided by OPD charge injection layer 330.

In one embodiment, the first layered assembly 10 includes the layers above dashed line 508 and the second layered assembly 20 includes the layers below dashed line 508 so that an interfacing layer of the first layered assembly 10 to the second layered assembly 20 is provided by OPD charge blocking layer 320 and further so that an interfacing layer of the second layered assembly 20 to the first layered assembly 10 is provided by OPD absorber layer 310.

In one embodiment, the first layered assembly 10 includes the layers above dashed line 510 and the second layered assembly 20 includes the layers below dashed line 510 so that an interfacing layer of the first layered assembly 10 to the second layered assembly 20 is provided by OPD absorber layer 310 and further so that an interfacing layer of the second layered assembly 20 to the first layered assembly 10 is provided by OPD charge blocking layer 322.

In one embodiment, the first layered assembly 10 includes the layers above dashed line 512 and the second layered assembly 20 includes the layers below dashed line 512 so that an interfacing layer of the first layered assembly to the second layered assembly 20 is provided by OPD charge blocking layer 322 and further so that an interfacing layer of the second layered assembly 20 to the first layered assembly 10 is provided by OPD charge injection layer 332.

In one embodiment, the first layered assembly 10 includes the layers above dashed line 514 and the second layered assembly 20 includes the layers below dashed line 514 so that an interfacing layer of the first layered assembly 10 to the second layered assembly 20 is provided by OPD charge injection layer 332 and further so that an interfacing layer of the second layered assembly 20 to the first layered assembly 10 is provided by electrode layer 206.

Regarding OPD charge injection layer 330, OPD charge injection layer 330 can be an electron injection layer where electrode layer 302 is provided by a cathode. OPD charge injection layer 330 can be hole injection layer where electrode layer 302 is an anode. Regarding OPD charge injection layer 332, OPD charge injection layer 332 can be an electron injection layer where electrode layer 206 is provided by a cathode. OPD charge injection layer 332 can be hole injection layer where electrode layer 206 is an anode. Regarding OPD charge injection layer 330 or 332 where provided by a hole injection layer, a hole injection layer as set forth herein can comprise, e.g., poly(3,4-ethylenedioxythiophene), and polymers based on the thieno[3,4b]thiophene (TT) monomer. Regarding OPD charge injection layer 330 or 332 where provided by an electron injection layer, an electron injection layer herein can comprise lithium oxide (Li2O), lithium fluoride (LiF), magnesium fluoride (MgF2), and cesium(II) carbonate (CsCO3).

Referring to the embodiment of FIG. 13 one or more of layers 302, 330, 320, 322, 332 can be optionally deleted.

Figure 14:
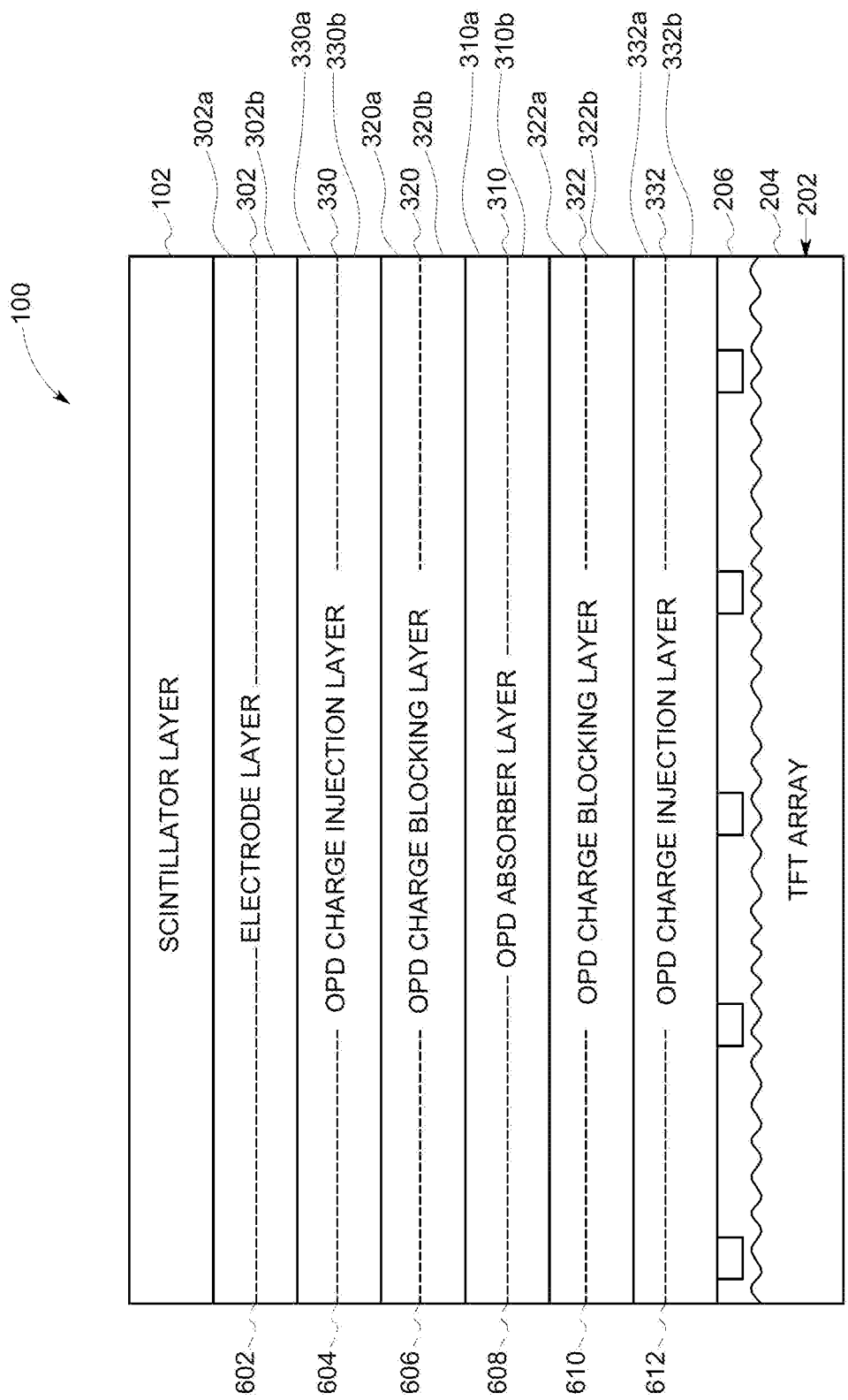
FIG. 14 is a schematic diagram illustrating additional methods as set forth herein.

In Examples 3 and 4 it was described that interfacing layers of first layered assembly 10 and second layered assembly 20 can be layers that perform a common function. In Example 3 it was described that respective interfacing layers of first layered assembly 10 and second layered assembly 20 can be OPD absorber layers. In Example 4, it was described that respective interfacing layers of a first layered assembly 10 and a second layered assembly 20 can be OPD charge blocking layers. Referring to FIG. 14 additional embodiments wherein adjacent interfacing layers of first layered assembly 10 and second layered assembly 20 perform a common function are described. Each electrode layer depicted in FIG. 14 can have a material composition described with reference to any electrode layer set forth herein. Each OPD charge injection layer depicted in FIG. 14 can have a material composition described with reference to any OPD injection layer set forth herein. Each OPD charge blocking layer depicted in FIG. 14 can have a material composition described with reference to any OPD charge blocking layer set forth herein. Each OPD absorber layer depicted in FIG. 14 can have a material composition described with reference to any OPD absorber layer set forth herein. FIG. 14 depicts an arrangement of adjacent layers. Regarding the embodiments of FIGS. 3-14, each of the embodiments of FIGS. 3-14 is depicted as being absent an adhesive material layer. However, use of one or more adhesive material layer can be advantageous in some embodiments.

In one embodiment, the first layered assembly 10 includes the layers above dashed line 602 and the second layered assembly 20 includes the layers below dashed line 602 so that an interfacing layer of the first layered assembly 10 to the second layered assembly 20 is provided by an electrode layer 302a and further so that an interfacing layer of the second layered assembly 20 to the first layered assembly 10 is provided by second electrode layer 302b.

In one embodiment, the first layered assembly 10 includes the layers above dashed line 604 and the second layered assembly 20 includes the layers below dashed line 604 so that an interfacing layer of the first layered assembly to the second layered assembly 20 is provided by an OPD charge injection layer 330a and further so that an interfacing layer of the second layered assembly 20 to the first layered assembly 10 is provided by second OPD charge injection layer 330b.

In one embodiment, the first layered assembly 10 includes the layers above dashed line 606 and the second layered assembly 20 includes the layers below dashed line 606 so that an interfacing layer of the first layered assembly to the second layered assembly 20 is provided by OPD charge blocking layer 320a and further so that an interfacing layer of the second layered assembly 20 to the first layered assembly 10 is provided by second OPD charge blocking layer 320b.

In one embodiment, the first layered assembly 10 includes the layers above dashed line 608 and the second layered assembly 20 includes the layers below dashed line 608 so that an interfacing layer of the first layered assembly 10 to the second layered assembly 20 is provided by OPD absorber layer 310a and further so that an interfacing layer of the second layered assembly 20 to the first layered assembly 10 is provided by second OPD absorber layer 310b.

In one embodiment, the first layered assembly 10 includes the layers above dashed line 610 and the second layered assembly 20 includes the layers below dashed line 610 so that an interfacing layer of the first layered assembly 10 to the second layers assembly 200 is provided by OPD charge blocking layer 322a and further so that an interfacing layer of the second layered assembly 20 to the first layered assembly 10 is provided by second OPD charge blocking layer 322b.

In one embodiment, the first layered assembly 10 includes the layers above dashed line 612 and the second layered assembly 20 includes the layers below dashed line 612 so that an interfacing layer of the first layered assembly 10 to the second layered assembly 20 is provided by OPD charge injection layer 332a and further so that an interfacing layer of the second layered assembly 20 to the first layered assembly 10 is provided by second OPD charge injection layer 332b.

Referring to the embodiment of FIG. 14, one or more of layers 302, 330, 320, 322, 332 can be optionally deleted.

Figure 15:
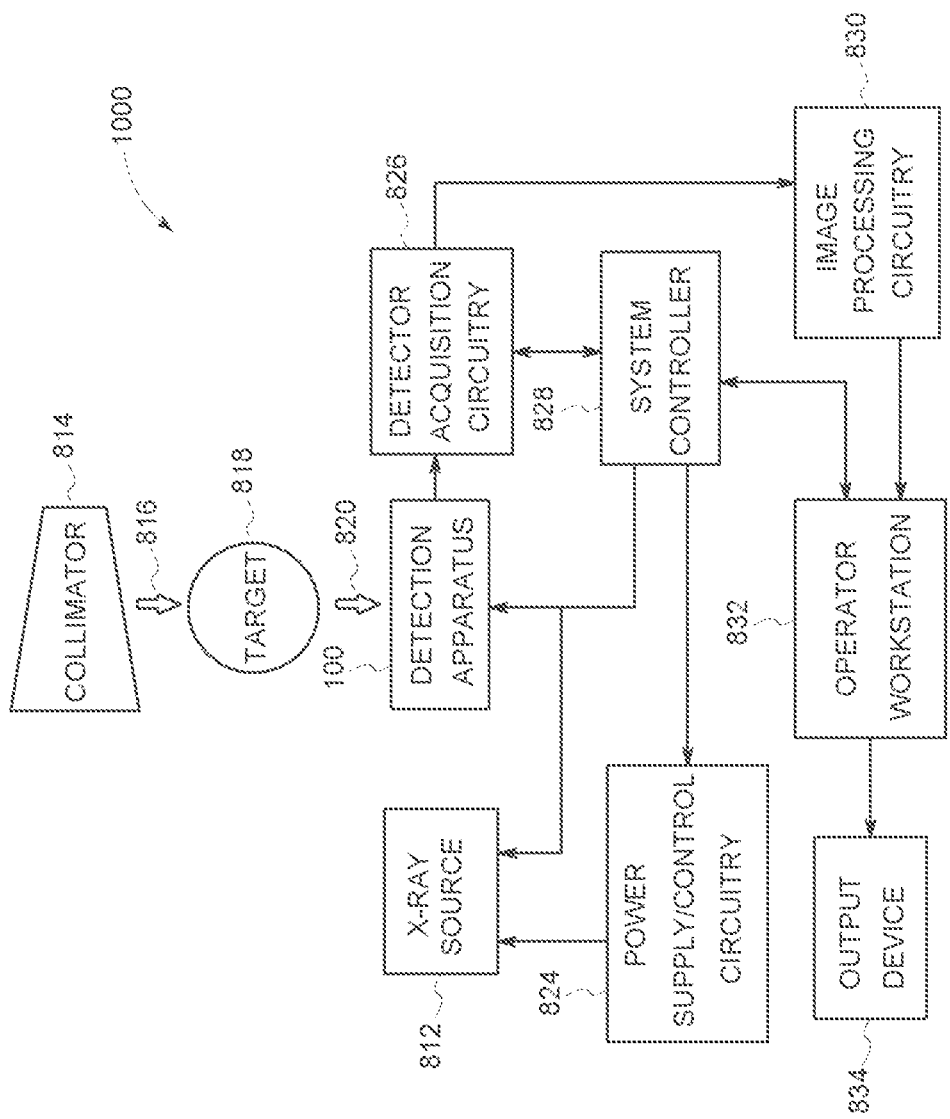
FIG. 15 is a schematic block diagram illustrating a system comprising an X ray detection apparatus.

FIG. 15 shows an embodiment of an X ray imaging system 1000, X ray imaging system 1000 can be designed to acquire and process X ray image data. The system 1000 includes an X ray source 812, a collimator 814, and an X ray detection apparatus 100, which is an apparatus for use in X ray detection. X ray detection apparatus 100 can be provided by an X ray detection apparatus 100 fabricated according to a method as set forth herein. The X ray source 812 can be positioned adjacent to the collimator 814. The X ray source 812 can be a low-energy source to be employed in low energy imaging techniques, such as fluoroscopic techniques. The collimator 814 can permit a stream of X ray radiation 816 emitted by the X ray source 812 to radiate towards a target 818, such as a human patient. A portion of the X ray radiation is attenuated by the target 818 and at least some attenuated radiation 820 impacts the detection apparatus 100, such as a fluoroscopic detector.

X ray detection apparatus 100 can be operative to detect X rays based on scintillation, i.e., optical conversion, direct conversion, or on other techniques used in the generation of electrical signals based on incident radiation. For example, a scintillator-based detector converts X ray photons incident on its surface to optical photons. These optical photons can then be converted to electrical signals by employing photosensor (s), e.g., photodiode(s). Conversely, a direct conversion detector directly generates electrical charges in response to incident X ray photons. The electrical charges can be stored and read out from storage capacitors. As described in detail below, these electrical signals, regardless of the conversion technique employed, are acquired and processed to construct an image of the features (e.g., anatomy) within the target 818.

X ray source 812 can be controlled by power supply/control circuitry 824 which furnishes both power and control signals for examination sequences. Moreover, X ray detection apparatus 100 can be coupled to detector acquisition circuitry 826, which can be configured to receive electrical readout signals generated in the X ray detection apparatus 100. Detector acquisition circuitry 826 can also execute various signal processing and filtration functions, such as, for initial adjustment of dynamic ranges, interleaving of digital, and so forth.

In the depicted exemplary embodiment, one or both of the power supply/control circuitry 824 and detector acquisition circuitry 826 can be responsive to signals from controller 28. System controller 28 can include signal processing circuitry, typically based upon a general purpose or application specific digital computer programmed to process signals according to one or more parameters. The system controller 828 can also include memory circuitry for storing programs and routines executed by the computer, as well as configuration parameters and image data, interface circuits, and so forth.

The system 1000 can include image processing circuitry 830 configured to receive acquired projection data from the detector acquisition circuitry 826. The image processing circuitry 830 can be configured to process the acquired data to generate one or more images based on X ray attenuation.

An operator workstation 832 can be communicatively coupled to the system controller 828 and/or the image processing circuitry 830 to allow an operator to initiate and configure X ray imaging of a target and to view images generated from X rays that impinge the X ray detection apparatus 100. For example, the system controller 828 is in communication with the operator workstation 832 so that an operator, via one or more input devices associated with the operator workstation 832, can provide instructions or commands to the system controller 828.

Similarly, the image processing circuitry 830 can be in communication with the operator workstation 832 such that the operator workstation 832 can receive and display the output of the image processing circuitry 830 on an output device 834, such as a display or printer. The output device 834 can include standard or special purpose computer monitors and associated processing circuitry. In general, displays, printers, operator workstations, and similar devices supplied within the system 1000 can be local to the data acquisition components or can be remote from these components, such as elsewhere within an institution or hospital or in an entirely different location. Output devices and operator workstations that are remote from the data acquisition components can be operatively coupled to the image acquisition system via one or more configurable networks, such as the Internet, virtual private networks, and so forth. As will be appreciated by one of ordinary skill in the art, though the system controller 828, image processing circuitry 830, and operator workstation 832 are shown distinct from one another in FIG. 15, these components can actually be embodied in a single processor-based computing system. Alternatively, some or all of these components can be present in distinct processor-based computing systems configured to communicate with one another. For example, the image processing circuitry 830 can be a component of a distinct reconstruction and viewing workstation.

Approximating language, as used herein throughout the specification and claims, can be applied to modify any quantitative representation that could permissibly vary without resulting in a change in the basic function to which it is related. Accordingly, a value modified by a term or terms, such as "about" is not to be limited to the precise value specified. In some instances, the approximating language can correspond to the precision of an instrument for measuring the value. Here and throughout the specification and claims, range limitations can be combined and/or interchanged; such ranges are identified and include all the sub-ranges contained therein unless context or language indicates otherwise. While the present invention has been described with reference to a number of specific embodiments, it will be understood that the true spirit and scope of the invention should be determined only with respect to claims that can be supported by the present specification. Further, while in numerous cases herein wherein systems and apparatuses and methods are described as having a certain number of elements it will be understood that such systems, apparatuses and methods can be practiced with fewer than or greater than the mentioned certain number of elements. Also, while a number of particular embodiments have been described, it will be understood that features and aspects that have been described with reference to each particular embodiment can be used with each remaining particularly described embodiment.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A method of making an apparatus for use in X ray detection, the method comprising:
   fabricating a first layered assembly, the first layered assembly comprising a scintillator layer and a first electrode layer; and
   laminating the first layered assembly onto a second layered assembly,
   wherein the second layered assembly has a thin film transistor (TFT) array, wherein the TFT array includes a second electrode layer, wherein one of the first layered assembly and the second layered assembly includes an organic photodiode (OPD) absorber layer, wherein the laminating is absent use of an adhesive, and wherein the laminating is performed so that when the laminating is complete the OPD absorber layer is disposed between the first electrode and the second electrode.

2. The method of claim 1, wherein the method includes fabricating the second layered assembly, the fabricating the second layered assembly including depositing an OPD charge blocking layer onto the TFT array.

3. The method of claim 1, wherein the method includes fabricating the second layered assembly, the fabricating the second layered assembly including depositing an OPD charge blocking layer onto the TFT array, wherein the scintillator layer includes a prefabricated scintillator and wherein the fabricating a first layered assembly includes depositing the first electrode layer on the scintillator layer, and depositing the OPD absorber layer on the first electrode layer after the first electrode layer is deposited on the scintillator layer, and wherein the laminating is performed so that an interfacing layer of the first layered assembly to the second layered assembly is the OPD absorber layer and further so that an interfacing layer of the second layered assembly to the first layered assembly is the OPD charge blocking layer.

4. The method of claim 1, wherein first layered assembly includes an OPD absorber layer, and wherein the second layered assembly includes an OPD charge blocking layer, and wherein the laminating is performed so that an interfacing layer of the first layered assembly to the second layered assembly is the OPD absorber layer and further so that an interfacing layer of the second layered assembly to the first layered assembly is the OPD charge blocking layer.

5. The method of claim 1, wherein an interfacing layer of the first layered assembly to the second layered assembly is polymer based and further so that an interfacing layer of the second layered assembly to the first layered assembly is polymer based.

6. The method of claim 1, wherein the scintillator layer includes a prefabricated scintillator and wherein the fabricating a first layered assembly includes depositing the first electrode layer on the scintillator layer, and depositing the OPD absorber layer on the first electrode layer after it is deposited on the scintillator layer, and wherein the second layered assembly includes a second OPD absorber layer.

7. The method of claim 1, wherein the scintillator layer includes a prefabricated scintillator and wherein the fabricating a first layered assembly includes depositing the first electrode layer on the scintillator layer, and depositing the OPD absorber layer on the first electrode layer after the first electrode layer is deposited on the scintillator layer, wherein the second layered assembly includes a second OPD absorber layer, and wherein the laminating is performed so that an interfacing layer of the first layered assembly to the second layered assembly is the OPD absorber layer and further so that an interfacing layer of the second layered assembly to the first layered assembly is the second OPD absorber layer.

8. The method of claim 1, wherein the first layered assembly includes the OPD absorber layer, and wherein the second layered assembly includes a second OPD absorber layer, and wherein the laminating is performed so that an interfacing layer of the first layered assembly to the second layered assembly is the OPD absorber layer and further so that an interfacing layer of the second layered assembly to the first layered assembly is the second OPD absorber blocking layer.

9. The method of claim 1, wherein the scintillator layer includes a prefabricated scintillator and wherein the fabricating a first layered assembly includes depositing the first electrode layer on the scintillator layer, and depositing the OPD absorber layer on the first electrode layer after the first electrode layer is deposited on the scintillator layer, and depositing an OPD charge blocking layer on the OPD absorber layer after the OPD absorber layer is deposited on the first electrode layer, and wherein the second layered assembly includes a second OPD charge blocking layer.

10. The method of claim 1, wherein first layered assembly includes an OPD charge blocking layer, and wherein the second layered assembly includes a second OPD charge layer, and wherein the laminating is performed so that an interfacing layer of the first layered assembly to the second layered assembly is the OPD charge blocking layer and further so that an interfacing layer of the second layered assembly to the first layered assembly is the second OPD charge blocking layer.

11. The method of claim 1, wherein the scintillator layer includes a prefabricated scintillator and wherein the fabricating a first layered assembly includes depositing the first electrode layer on the scintillator layer, and wherein the second layered assembly includes the OPD absorber layer.

12. The method of claim 1, wherein the second layered assembly includes the OPD absorber layer, and wherein the laminating is performed so that an interfacing layer of the first layered assembly to the second layered assembly is the first electrode layer and further so that an interfacing layer of the second layered assembly to the first layered assembly is the OPD absorber layer.

13. The method of claim 1, wherein the second layered assembly includes the OPD absorber layer, wherein the laminating is performed so that an interfacing layer of the first layered assembly to the second layered assembly is the first electrode layer and further so that an interfacing layer of the second layered assembly to the first layered assembly is the OPD absorber layer, and wherein the first electrode layer comprises polymer based material.

14. The method of claim 1, wherein the first layered assembly includes a charge blocking layer and wherein the laminating is performed so that an interfacing layer of the first layered assembly to the second layered assembly is the charge blocking layer and further so that an interfacing layer of the second layered assembly to the first layered assembly is the second electrode layer.

15. An apparatus for use in X ray detection, the apparatus comprising:
   a scintillator layer;
   first electrode layer adjacent the scintillator layer, wherein the apparatus includes a deposition bond that bonds the first electrode layer and the scintillator layer;
   an organic photodiode (OPD) absorber layer;
   a thin film transistor (TFT) array, the TFT array having a second electrode layer;
   wherein the OPD absorber layer is disposed intermediate the first electrode layer and the second electrode layer, wherein the apparatus is absent an adhesive material layer intermediate the scintillator layer and the second electrode layer, and wherein the scintillator layer includes a prefabricated scintillator.

16. The apparatus of claim 15, wherein the first electrode layer is polymer based.

17. The apparatus of claim 15, wherein the first electrode layer is an anode comprising a p-doped conjugated polymer.

18. The apparatus of claim 15, wherein the first electrode layer is a cathode comprising an n-doped conjugated polymer.

19. The apparatus of claim 15, wherein the scintillator layer includes a prefabricated scintillator having a polarizing sublayer deposited thereon.

20. The apparatus of claim 15, wherein the TFT array is a prefabricated TFT array.

* * * * *